(12) United States Patent
Shinoda et al.

(10) Patent No.: US 11,709,421 B2
(45) Date of Patent: Jul. 25, 2023

(54) IMPRINT APPARATUS

(71) Applicant: CANON KABUSHIKI KAISHA, Tokyo (JP)

(72) Inventors: Ken-ichiro Shinoda, Utsunomiya (JP); Tooru Kawashima, Shioya-gun (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/819,739

(22) Filed: Mar. 16, 2020

(65) Prior Publication Data

US 2020/0319547 A1 Oct. 8, 2020

(30) Foreign Application Priority Data

Apr. 2, 2019 (JP) .............................. JP2019-070709

(51) Int. Cl.
*G03F 7/00* (2006.01)
*G03F 9/00* (2006.01)
*B29C 33/42* (2006.01)
*B29C 59/02* (2006.01)
*G02B 5/00* (2006.01)

(52) U.S. Cl.
CPC .......... *G03F 7/0002* (2013.01); *B29C 33/424* (2013.01); *G03F 7/70633* (2013.01); *G03F 7/70683* (2013.01); *G03F 9/7042* (2013.01); *G03F 9/7088* (2013.01); *B29C 2033/426* (2013.01); *B29C 2059/023* (2013.01); *G02B 5/005* (2013.01); *G03F 7/70775* (2013.01); *G03F 9/7065* (2013.01);

(Continued)

(58) Field of Classification Search
CPC ... G03F 7/0002; G03F 7/70683; G02B 5/005; G03B 9/02; G03B 9/06
See application file for complete search history.

(56) References Cited

U.S. PATENT DOCUMENTS 8,703,035 B2 * 4/2014 Sato ...................... G03F 9/7049
264/293
9,971,256 B2 * 5/2018 Yamamoto ............ G03F 7/0002
(Continued)

FOREIGN PATENT DOCUMENTS

JP 2013175684 A 9/2013
JP 2015012034 A 1/2015
(Continued)

OTHER PUBLICATIONS

Auerbach, Jerome M., and Victor P. Karpenko. "Serrated-aperture apodizers for high-energy laser systems." Applied optics 33.15 (May 20, 1994): 3179-3183. (Year: 1994).*

*Primary Examiner* — Benjamin A Schiffman
(74) *Attorney, Agent, or Firm* — Rossi, Kimms & McDowell LLP

(57) ABSTRACT

An imprint apparatus for forming a pattern of an imprint material on a substrate using a mold having a mesa including a pattern region where a pattern and a mark are formed. The apparatus includes an alignment optical system which includes an illumination system configured to illuminate the mark with illumination light and a detecting system configured to detect an image of the mark illuminated by the illumination system. The illumination system includes a limiter configured to limit incidence of the illumination light to a side of the mesa, a ridge line of the mesa, and an outer region of the side.

14 Claims, 18 Drawing Sheets

(52) U.S. Cl.
CPC .......... *G03F 9/7069* (2013.01); *G03F 9/7073* (2013.01); *G03F 9/7084* (2013.01)

(56) References Cited

U.S. PATENT DOCUMENTS

| | | | | |
|---|---|---|---|---|
| 2011/0278768 | A1* | 11/2011 | Sato | B82Y 40/00 |
| | | | | 425/150 |
| 2013/0221556 | A1 | 8/2013 | Miyaharu | |
| 2014/0367874 | A1* | 12/2014 | Yamamoto | G03F 7/0002 |
| | | | | 264/293 |
| 2015/0004275 | A1 | 1/2015 | Miyajima | |
| 2018/0067392 | A1 | 3/2018 | Murasato | |

FOREIGN PATENT DOCUMENTS

| | | | | |
|---|---|---|---|---|
| JP | 2017022243 | A | * | 1/2017 |
| JP | 2017022243 | A | | 1/2017 |
| JP | 2018041774 | A | | 3/2018 |

* cited by examiner

IMPRINT APPARATUS

BACKGROUND OF THE INVENTION

Field of the Invention

The present invention relates to an imprint apparatus and an article manufacturing method.

Description of the Related Art

In an imprint technique for manufacturing an article such as a semiconductor device, a mold on which a pattern is formed is brought into contact with an imprint material arranged on a substrate, and the imprint material is cured by irradiation with curing energy, thereby forming a pattern made of a cured product of the imprint material. A pattern is formed for each of a plurality of shot regions of the substrate. A shot region and the mold can be aligned by detecting the relative position between a mark on the mold and a mark on the shot region as an alignment target. This detecting can be called alignment detecting.

The mold can include a portion called a mesa protruding from a peripheral portion. The mesa includes a pattern region contacting the imprint material, and a mark and a pattern to be transferred to the imprint material can be arranged on the pattern region. In alignment detecting, the mark on the mold and the mark on the shot region are illuminated with illumination light, and a mark image formed by light from these marks can be detected. Since the mark provided on the pattern region of the mold is formed near the side of the mesa, the contrast of the mark image may decrease due to light (reflected light, scattered light, and diffracted light) from the side of the mesa or the like when irradiating the mark with illumination light.

As described in Japanese Patent Laid-Open No. 2015-12034, in some molds, a light-shielding film is provided to prevent a portion outside the shot region, where a pattern is to be formed, from being irradiated with curing light. If a mold including such light-shielding film is used, illumination light with which the mark is illuminated is reflected by the light-shielding film in alignment detecting, thereby decreasing the contrast of a mark image.

SUMMARY OF THE INVENTION

The present invention provides a technique advantageous in suppressing degradation in quality of a mark image caused by light from a structure other than a mark on a mold.

According to one aspect of the present invention, there is provided an imprint apparatus for forming a pattern of an imprint material on a substrate using a mold having a mesa including a pattern region where a pattern and a mark are formed, comprising: an alignment optical system, wherein the alignment optical system includes an illumination system configured to illuminate the mark with illumination light and a detecting system configured to detect an image of the mark illuminated by the illumination system, and the illumination system includes a limiter configured to limit incidence of the illumination light to a side of the mesa, a ridge line of the mesa, and an outer region of the side.

Further features of the present invention will become apparent from the following description of exemplary embodiments with reference to the attached drawings.

DESCRIPTION OF THE EMBODIMENTS

Figure 1:
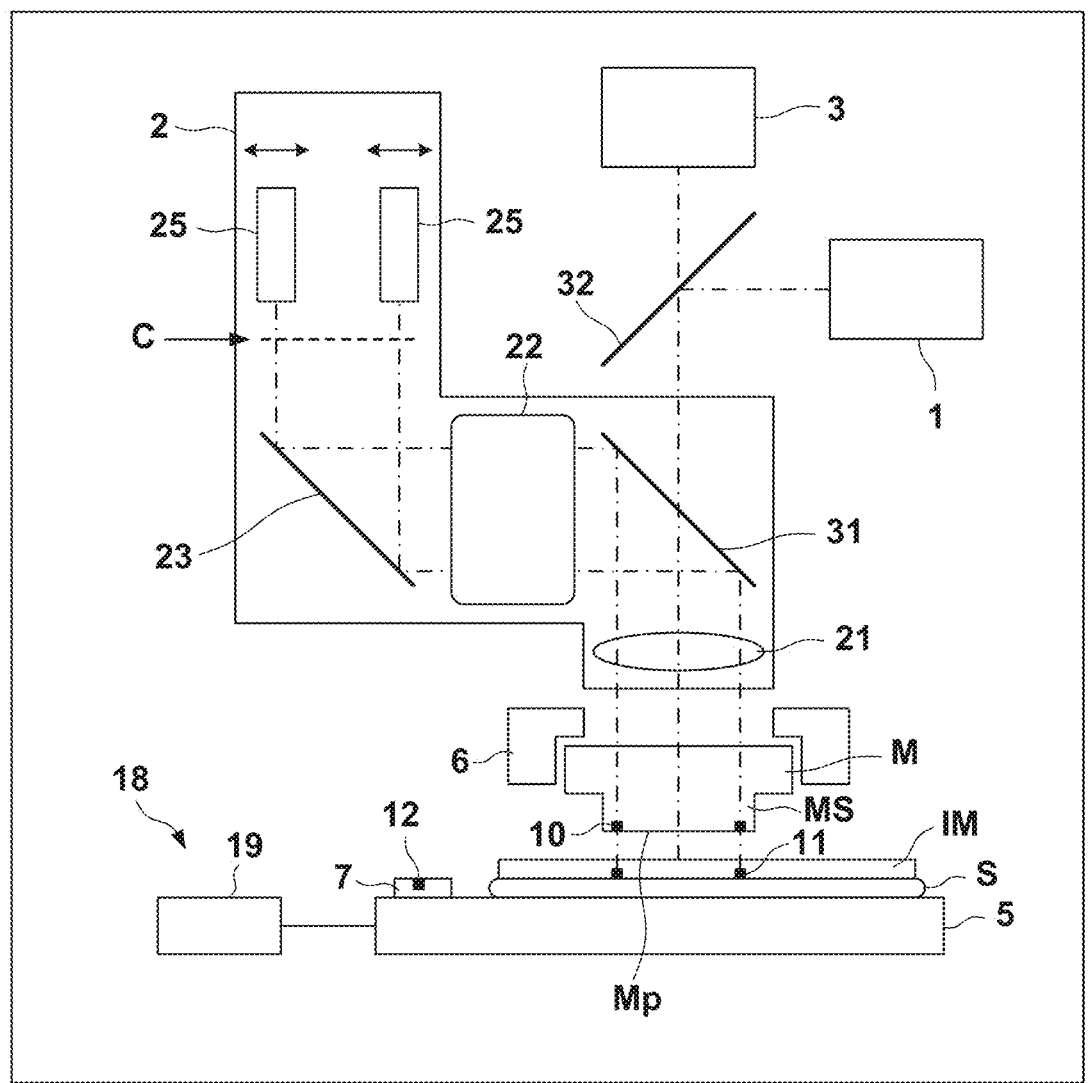
FIG. 1 is a view showing the arrangement of an imprint apparatus according to an embodiment.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

FIG. 1 shows the arrangement of an imprint apparatus 100 according to an embodiment. The imprint apparatus 100 cures an imprint material IM arranged on a substrate S by bringing a pattern region Mp on a mold M into contact with the imprint material IM, and irradiating the imprint material IM with curing energy. This forms a pattern made of a cured product of the imprint material IM on the substrate S. As the imprint material, a curable composition (to be also referred to as a resin in an uncured state) to be cured by receiving curing energy is used. As the curing energy, an electromagnetic wave or heat can be used. The electromagnetic wave can be, for example, light selected from the wavelength range of 10 nm (inclusive) to 1 mm (inclusive), for example, infrared light, a visible light beam, or ultraviolet light. The curable composition can be a composition cured by light irradiation or heating. Among compositions, a photo-curable composition cured by light irradiation contains at least a polymerizable compound and a photopolymerization initiator, and may further contain a nonpolymerizable compound or a solvent, as needed. The nonpolymerizable compound is at least one material selected from the group consisting of a sensitizer, a hydrogen donor, an internal mold release agent, a surfactant, an antioxidant, and a polymer component. The imprint material can be arranged on the substrate in the form of droplets or in the form of an island or film formed by connecting a plurality of droplets. The imprint material may be supplied onto the substrate in the form of a film by a spin coater or a slit coater. The viscosity (the viscosity at 25° C.) of the imprint material can be, for example, 1 mPa·s (inclusive) to 100 mPa·s (inclusive). As the material of the substrate, for example, glass, a ceramic, a metal, a semiconductor, a resin, or the like can be used. A member made of a material different from the substrate may be provided on the surface of the substrate, as needed. The substrate is, for example, a silicon wafer, a compound semiconductor wafer, or silica glass.

In the specification and the accompanying drawings, directions will be indicated on an XYZ coordinate system in which directions parallel to the surface of the substrate S are defined as the X-Y plane. Directions parallel to the X-axis, the Y-axis, and the Z-axis of the XYZ coordinate system are the X direction, the Y direction, and the Z direction, respectively. A rotation about the X-axis, a rotation about the Y-axis, and a rotation about the Z-axis are θX, θY, and θZ, respectively. Control or driving concerning the X-axis, the Y-axis, and the Z-axis means control or driving concerning a direction parallel to the X-axis, a direction parallel to the Y-axis, and a direction parallel to the Z-axis, respectively. In addition, control or driving concerning the θX-axis, the θY-axis, and the θZ-axis means control or driving concerning a rotation about an axis parallel to the X-axis, a rotation about an axis parallel to the Y-axis, and a rotation about an axis parallel to the Z-axis, respectively. In addition, a position is information that can be specified based on coordinates on the X-, Y-, and Z-axes, and an orientation is information that can be specified by values on the θX-, θY-, and θZ-axes. Positioning means controlling the position and/or orientation. Alignment (positioning) can include controlling the position and/or orientation of at least one of the substrate S and the mold M such that the alignment error (overlay error) between the shot region of the substrate S and the pattern region Mp of the mold M decreases. In addition, alignment can include control to correct or change the shape of at least one of the shot region of the substrate S and the pattern region of the mold M.

The imprint apparatus 100 that uses light as curing energy will be exemplified below. However, the imprint apparatus 100 may use another curing energy such as heat energy. The imprint apparatus 100 can include a mold driving mechanism 6, a substrate driving mechanism 18, a curing unit 1, an alignment optical system 2, an observation optical system 3, and a controller 17. The mold M includes a mesa MS including the pattern region Mp, and a pattern (device pattern) to be transferred to the imprint material IM on the shot region of the substrate S and a mark (alignment mark) 10 are formed on the pattern region Mp. In one example, ultraviolet light is used as curing energy, and the mold M can be made of, for example, quartz that can transmit ultraviolet light.

The mold driving mechanism 6 can include, for example, a mold chuck that holds the mold M, a mold driving actuator that drives the mold M by driving the mold chuck, and a mold deforming mechanism that deforms the mold M. For example, the mold deforming mechanism can control a magnification, distortion, and the like by deforming the pattern region Mp. The mold driving mechanism 6 can be configured to drive the mold M with respect to a plurality of axes (for example, three axes including the Z-axis, θX-axis, and θY-axis, and preferably six axes including the X-axis, Y-axis, Z-axis, θX-axis, θY-axis, and θZ-axis).

The substrate driving mechanism 18 can include a substrate stage 5 that holds the substrate S, and a substrate driving actuator 19 that drives the substrate S by driving the substrate stage 5. The substrate stage 5 can be provided with a reference plate 7 including a reference mark 12. The substrate S can be loaded to the imprint apparatus 100 in, for example, a state in which an externally provided dispenser arranges the imprint material IM on the substrate S. Alternatively, the imprint apparatus 100 may include a dispenser, and the dispenser may arrange the imprint material IM on the substrate S. The substrate driving mechanism 18 can be configured to drive the substrate S with respect to a plurality of axes (for example, three axes including the X-axis, Y-axis, and θZ-axis, and preferably six axes including the X-axis, Y-axis, Z-axis, θX-axis, θY-axis, and θZ-axis).

The mold driving mechanism 6 and the substrate driving mechanism 18 form a relative driving mechanism that drives at least one of the substrate S and the mold M so as to adjust the relative position between the substrate S and the mold M. Adjustment of the relative position by the relative driving mechanism can include contact of the mold M to the imprint material IM on the substrate S and driving to separate the mold M from the cured imprint material IM. In addition, adjustment of the relative position by the relative driving mechanism can include alignment between the substrate S (the shot region thereof) and the mold M (the pattern region Mp thereof).

The above-described relative driving mechanism brings the imprint material IM on the shot region of the substrate S and the pattern region Mp of the mold M into contact with each other. In this state, a concave portion forming the pattern of the pattern region Mp is filled with the imprint material IM. After that, the curing unit 1 irradiates the imprint material IM on the shot region with light energy as curing energy. The curing unit 1 can include, as a light source, at least one light source selected from, for example, a high-pressure mercury lamp, an excimer lamp, an excimer laser, a light-emitting diode, and a laser diode. A light source to be used can appropriately be selected in accordance with the characteristic of the imprint material IM.

The alignment optical system 2 performs alignment detecting for alignment between the mold M and the shot region of the substrate S. The alignment optical system 2 can detect the mark 10 provided on the mold M. Detecting of the mark 10 can include detecting, as image data, a mark image (an optical image of the mark) formed by the mark 10, and detecting the position of the mark 10 based on the image data. Furthermore, the alignment optical system 2 can detect the relative position between the mark 10 provided on the mold M and a mark (alignment mark) 11 provided on the shot region of the substrate S. Detecting of the relative position between the marks 10 and 11 by the alignment optical system 2 can include detecting, as image data, the mark images (optical images of the marks) formed by the marks 10 and 11, and calculating the relative position based on the image data. The mark images formed by the marks 10 and 11 can include the image of the mark 10 and the image of the mark 11. The image of the mark 10 and the image of the mark 11 may be formed in a state in which they are separated in different regions or may be overlaid and formed in a common region. The mark images are formed on the imaging plane of the image sensor of the alignment optical system 2. The alignment optical system 2 can additionally be used to detect the relative position between the mark 10 on the mold M and the reference mark 12 on the reference plate 7.

The alignment optical system 2 can include one or a plurality of scopes 25 whose positions can be adjusted with respect to the X-axis direction and the Y-axis direction. The position of the scope 25 in the X-axis direction and the Y-axis direction is adjusted in accordance with the positions of the marks to be detected, for example, a pair of positions of the mark 10 on the mold M and the mark 11 on the shot region of the substrate S, thereby adjusting the field of view of the scope 25. The scope 25 has a focus function, and the focus function can be implemented by adjusting the position of the scope 25 in the Z-axis direction. The alignment optical system 2 can include optical components 21, 31, 22, and 23 forming a relay optical system. The relay optical system can form images of the marks 10 and 11 on a surface C conjugate to a surface on which the surface of the substrate S is arranged. The scope 25 can illuminate the field of view with alignment illumination light.

The controller 17 controls the mold driving mechanism 6, the substrate driving mechanism 18, the curing unit 1, the alignment optical system 2, and the observation optical system 3. The controller 17 can be formed from, for example, a PLD (the abbreviation of a Programmable Logic Device) such as an FPGA (the abbreviation of a Field Programmable Gate Array), an ASIC (the abbreviation of an Application Specific Integrated Circuit), a general-purpose or dedicated computer embedded with a program, or a combination of all or some of these components.

On the substrate S, various kinds of materials are formed in the form of a multilayer film, and the mark 11 on the substrate S can be arranged in an arbitrary layer of the multilayer film. Therefore, if the wavelength band of the alignment optical system 2 is narrow and light has a wavelength of a destructive interference condition, light from the mark 11 on the substrate S becomes feeble, and the quality of the mark image of the mark 11 formed on the surface C may become insufficient. Thus, the wavelength of alignment illumination light used in the alignment optical system 2 is desirably a wavelength that does not cure the imprint material IM, and covers a wide band as much as possible. For example, the wavelength of alignment illumination light desirably covers a wavelength band of 400 to 2,000 nm but should cover at least a wavelength band of 500 to 800 nm. As a light source that generates alignment illumination light, for example, a lamp with a wide light emission wavelength band can be adopted. Alternatively, a plurality of light sources (a light-emitting diode, a laser diode, and the like) each having a light emission wavelength band of several tens of nm or several nm may be combined to discretely cover a wide band. The substrate driving mechanism 18, the mold driving mechanism 6, and the like can be controlled based on the relative position between the mold M and the shot region of the substrate S measured by the alignment optical system 2.

The observation optical system 3 can serve as a scope that observes the entire shot region of the substrate S. The observation optical system 3 can be used to observe the state of an imprint process, for example, a contact state between the mold M and the imprint material IM on the shot region, the filling state of the imprint material IM to the concave portion of the pattern region Mp of the mold M, and the separation state between the mold M and the imprint material IM on the substrate S. The target of observation by the observation optical system 3 can be the pattern region Mp of the mold M, the surface of the substrate S, or the pattern region Mp and the surface of the substrate S in a close state. The field of view of the observation optical system 3 is preferably wider than the pattern region Mp. Since there is no pattern in the vicinity of the pattern region Mp, the observation optical system 3 can observe the state of the imprint material IM and/or the substrate S through the mold M.

The observation optical system 3 illuminates the field of view with observation illumination light. Observation illumination light does not require a wavelength band as wide as that of alignment illumination light used in the alignment optical system 2, and need only have a wavelength that does not cure the imprint material IM. To prevent the mold M or the substrate S from being deformed due to heat generated by irradiation with observation illumination light to cause a position error and distortion in the pattern transferred to the imprint material IM, observation illumination light is desirably feeble within an observable range.

Observation illumination light of the observation optical system 3 and curing light of the curing unit 1 can be synthesized by an optical component (synthesizer) 32. Light from another optical system may be synthesized by the optical component 32, as needed. For example, to locally deform the substrate S, light from a thermal deformation unit (not shown) for irradiating the substrate S with thermal deformation light via the mold M can be synthesized by the optical component 32.

In the example shown in FIG. 1, the optical component (common optical system) 21 is provided in the alignment optical system 2. The optical component 21 can be used to irradiate the mold M and/or substrate S with curing light, alignment illumination light, observation illumination light, and thermal deformation light. The optical component 31 reflects alignment light and transmits curing light, observation illumination light, and thermal deformation light. The optical components 21 and 31 can be made of a material (for example, quartz or fluorite) having a transmittance high enough with respect to curing light from the curing unit 1. The optical component 31 is, for example, a dichroic mirror, and has, in one example, a characteristic in which a reflectance in a wavelength band of 500 to 2,000 nm is high and a transmittance in a wavelength band of 200 to 500 nm is high. The wavelength band in which the reflectance is high is not limited to a wavelength band of 500 to 2,000 nm, and is desirably wider but may be, for example, a wavelength band of 600 to 900 nm or 500 to 800 nm due to constraints on manufacturing. Similarly, the wavelength band in which the transmittance is high is not limited to a wavelength band of 200 to 500 nm, and is desirably wider but may be, for example, a wavelength band of 300 to 600 nm or 300 to 500 nm. The optical component 32 has an action of reflecting curing light and transmitting observation illumination light and thermal deformation light. The optical component 32 can be, for example, a dichroic mirror. In one example, the optical component 32 can have a characteristic in which a reflectance in a wavelength band of 400 nm or less (200 to 400 nm or 300 to 400 nm) is high and a transmittance in a wavelength band of 400 nm or more (400 to 500 nm or 400 to 600 nm) is high. A wavelength threshold is not limited to 400 nm, and may be, for example, 380 nm or 420 nm.

In one example, the wavelength band of curing light is an ultraviolet region, the wavelength band of alignment illumination light is on a longer wavelength side than curing light, and the wavelength bands of observation illumination light and thermal deformation light are between curing light and alignment illumination light. With the above arrangement, curing light that requires a high illuminance at a wavelength that cures the imprint material IM and alignment illumination light, observation illumination light, and thermal deformation light each of which requires a wide wavelength band can be used together.

Figure 2:
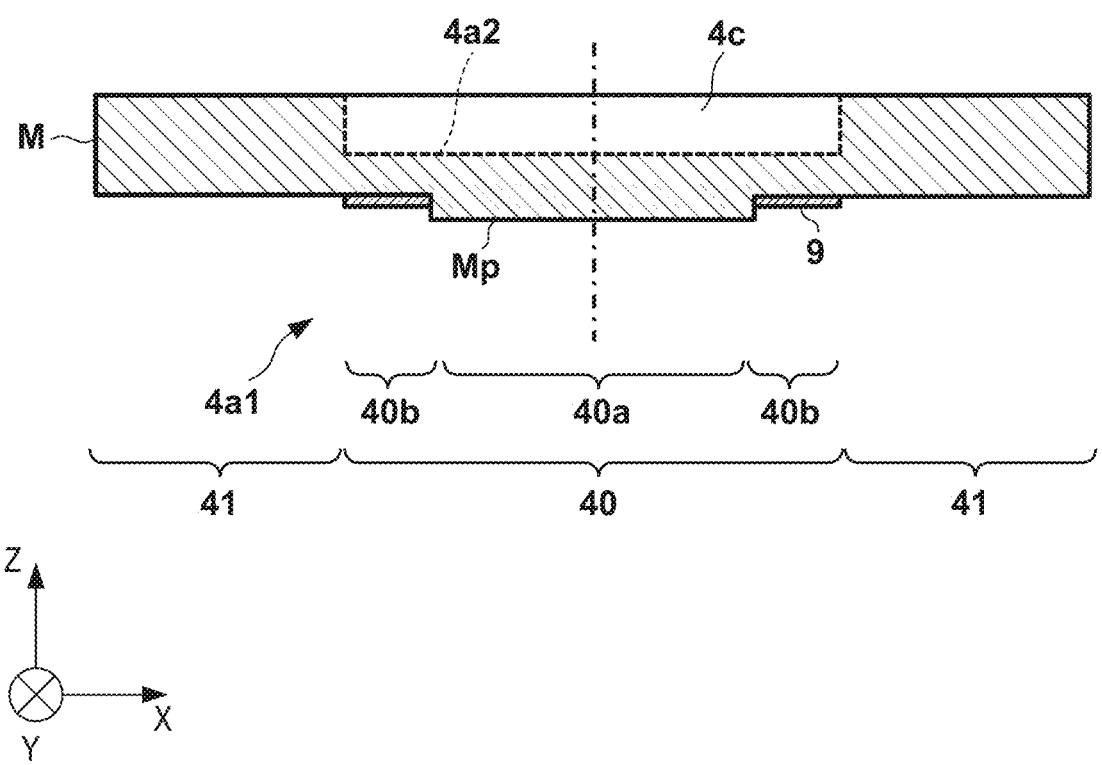
FIG. 2 is a schematic view exemplifying the sectional structure of a mold.

FIG. 2 schematically shows the sectional structure of the mold M. The mold M can be made of a material that transmits curing light such as ultraviolet light, for example, quartz. The mold M can include a first portion 40 and a second portion 41. The first portion 40 includes a first surface 4a1, and a second surface 4a2 opposite to the first surface 4a1. The first surface 4a1 can include a mesa (pattern portion) 40a with the pattern region Mp where the pattern is formed, and a peripheral portion (off-mesa) 40b that surrounds the mesa 40a. The second portion 41 surrounds the first portion 40, and has a thickness larger than that of the first portion 40. The mold M can include a concave portion (cavity) 4c that has the second surface 4a2 as a bottom surface and is surrounded by a wall surface defined by the boundary between the first portion 40 and the second portion 41. This arrangement is advantageous in deforming the mold M (first surface 4a1) by controlling the air pressure of the concave portion 4c. The mesa 40a protrudes from the peripheral portion 40b. The mesa 40a includes the pattern region Mp where the pattern to be transferred to the imprint material IM on the substrate S is formed.

The substrate S can be formed by, for example, a single-crystal silicon substrate. On the upper surface of the substrate S, for example, the imprint material IM can be applied or arranged by an application apparatus (resist coater) arranged outside the imprint apparatus 100. A step of applying or arranging the imprint material IM on the substrate S may be implemented by a dispenser provided in the imprint apparatus 100.

Figure 3:
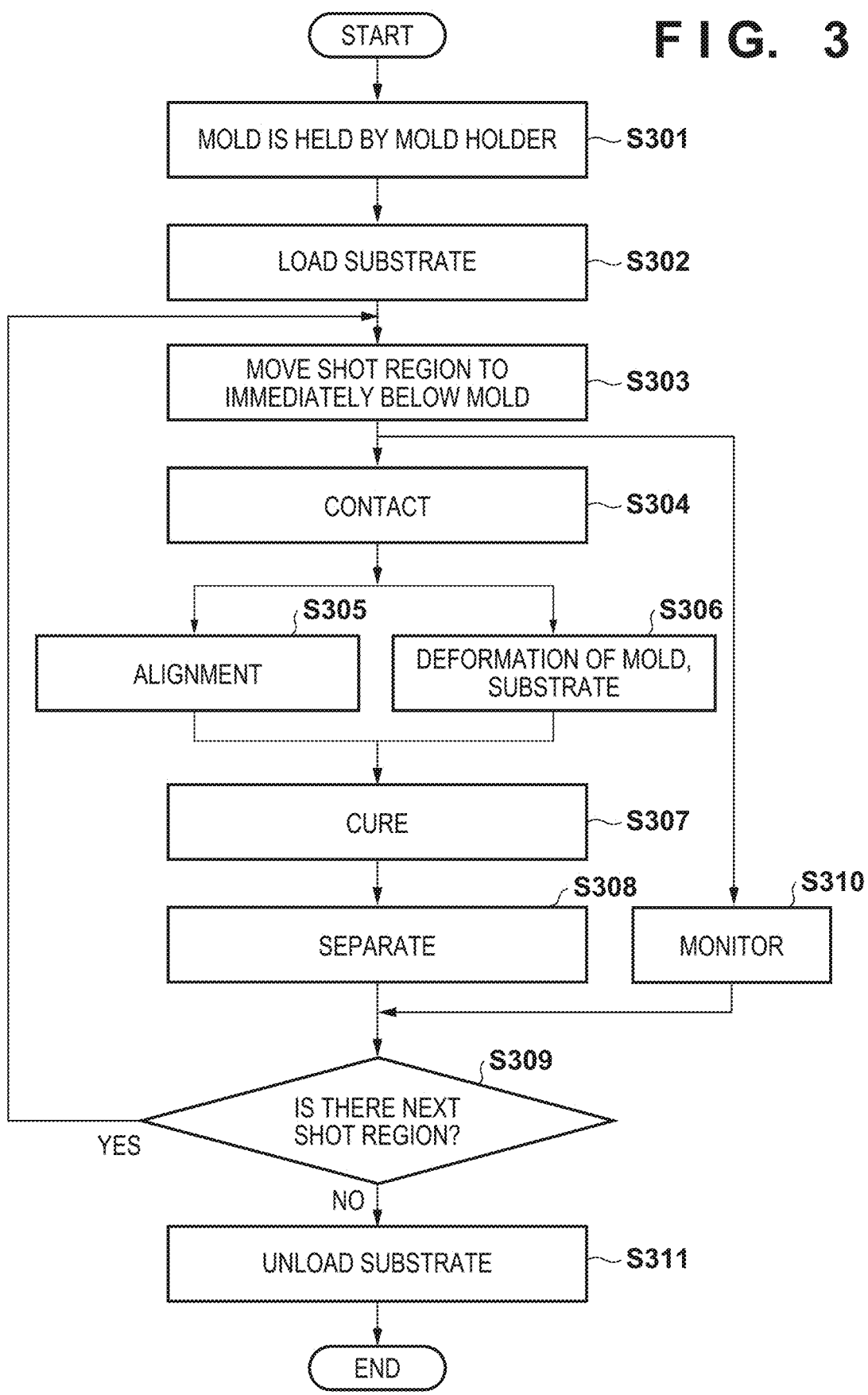
FIG. 3 is a flowchart illustrating an example of the operation of the imprint apparatus according to the embodiment.

FIG. 3 exemplifies the operation of the imprint apparatus 100. The operation shown in FIG. 3 can be controlled by the controller 17. The imprint apparatus 100 molds the imprint material IM on the substrate S (forms the pattern of the imprint material IM on the substrate S) using the mold M with the mesa including the pattern region Mp where the pattern and the mark are formed. In step S301, the mold M can be conveyed to the mold driving mechanism 6 by a mold conveyance mechanism (not shown), and held by the mold holder of the mold driving mechanism 6. At this time, by measuring the relative position between the mark 10 on the mold M and the reference mark 12 on the reference plate 7 using the alignment optical system 2, the mold M can be positioned with respect to the coordinate system for controlling the substrate stage 5. The position of the reference mark 12 on the reference plate 7 can be detected via the peripheral portion 40b of the mold M. The reason for this is that if the position of the reference mark 12 on the reference plate 7 is detected via the mesa 40a of the mold M, alignment illumination light is scattered and diffracted by the pattern of the mesa 40a.

In step S302, the substrate S is conveyed to the substrate stage 5 by a substrate conveyance mechanism, and held by the substrate chuck of the substrate stage 5. A description will be provided by assuming that the imprint material IM is arranged in advance on the substrate S. In step S303, the substrate stage 5 is positioned so that a shot region where the pattern is to be formed immediately after is located immediately below the mold M. In step S304, the mold M and/or the substrate S is driven by the mold driving mechanism 6 and/or substrate driving mechanism 18 to bring the imprint material IM on the shot region and the pattern region Mp of the mold M into contact with each other. In this state, the concave portion of the pattern region Mp of the mold M is filled with the imprint material IM.

Next, steps S305 and S306 can be executed in parallel. In step S305, the alignment optical system 2 detects the relative position between the mark 10 on the mold M and the mark 11 on the shot region of the substrate S, and the mold M and the shot region of the substrate S are aligned based on this result. Alignment can include driving of the substrate S by the substrate driving mechanism 18 and/or driving of the mold M by the mold driving mechanism 6. Alignment can include deformation of the mold by a mold deforming mechanism provided in the mold driving mechanism 6 and/or thermal deformation of the substrate S by a thermal deformation unit.

After the end of alignment between the mold M and the shot region of the substrate S, the imprint material IM on the shot region is cured, in step S307, by curing light from the curing unit 1. In step S308, the mold driving mechanism 6 and/or substrate driving mechanism 18 drives the mold M and/or substrate S so as to separate the cured product of the imprint material IM on the shot region and the pattern region Mp of the mold M. In step S309, it is determined whether the pattern has been formed on all the plurality of shot regions of the substrate S. If there exists a shot region where the pattern has not been formed, steps S303 to S308 are executed for the shot region. If the pattern has been formed on all the plurality of shot regions of the substrate S, the substrate S is unloaded from the substrate stage 5 in step S311. Steps S304 to S308 are monitored using the observation optical system 3. If an abnormality occurs, an error process can be executed to remove the abnormality.

Figure 4A:
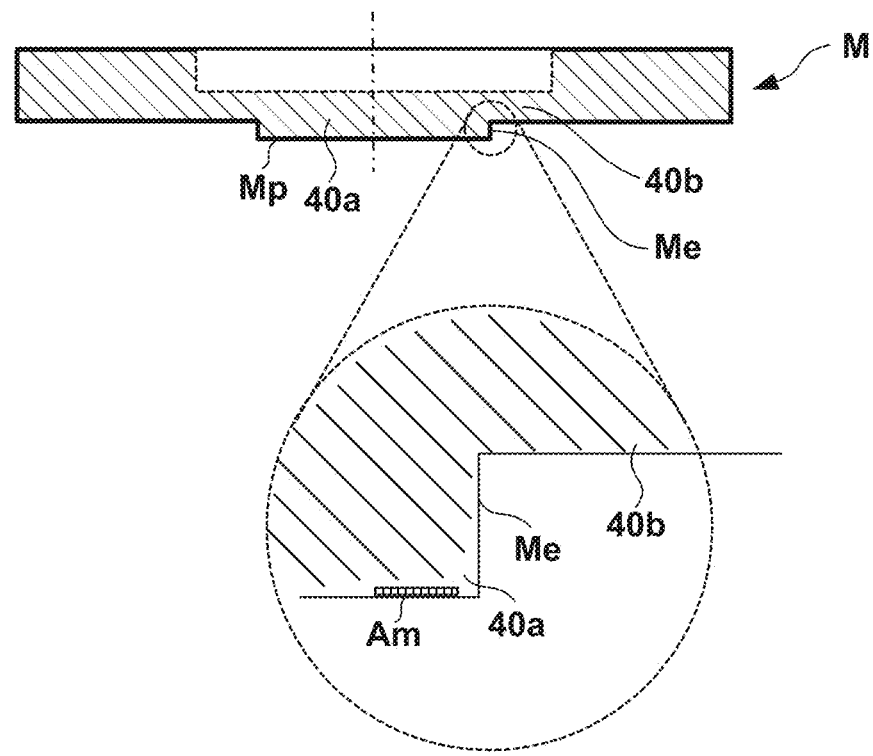
FIGS. 4A and 4B are views exemplifying a problem.
Figure 4B:
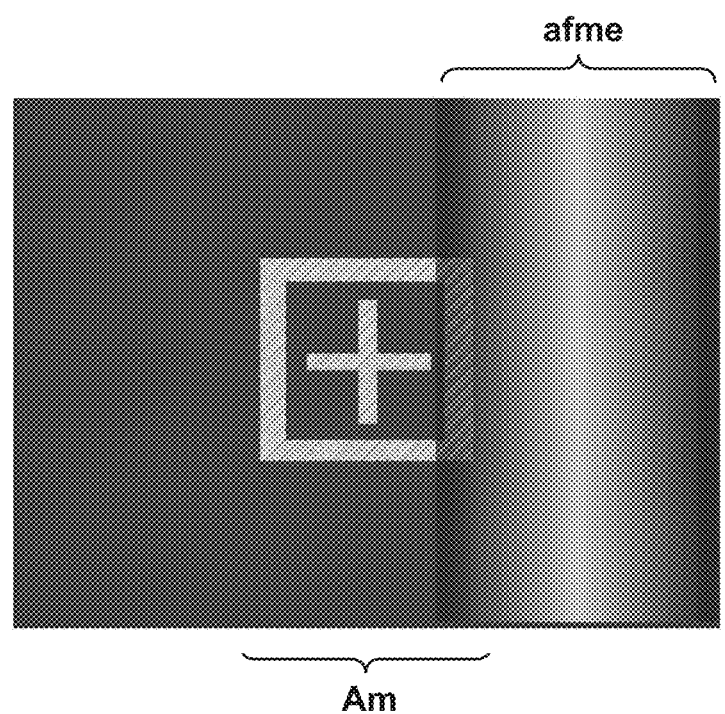

A problem in detecting the mark image by the alignment optical system 2 will be described below with reference to FIGS. 4A to 8B. The first example will be described with FIGS. 4A and 4B. FIG. 4A schematically shows the sectional structure of the mold M in the first arrangement example. In the first arrangement example shown in FIG. 4A, a side (mesa edge) Me of the mesa 40a stands upright with respect to the peripheral portion 40b. The pattern region Mp of the mesa 40a and the side Me of the mesa 40a form a ridge line. The ridge line also serves as the outer edge of the pattern region Mp. A mark Am (corresponding to the mark 10) is generally arranged in a region called a scribe line provided between the device pattern region and the outer edge. FIG. 4B schematically shows a result (image data) of detecting the mark Am of the mold M in the first arrangement example by the alignment optical system 2. A region afme shown in FIG. 4B is a light intensity distribution formed by light from the ridge line and the side Me of the mesa 40a, and the skirt of the light intensity distribution is overlaid on the mark image of the mark Am. Consequently, the quality of the mark image degrades, and it is impossible to, for example, correctly detect the position (for example, the central position) of the mark image.

Figure 5A:
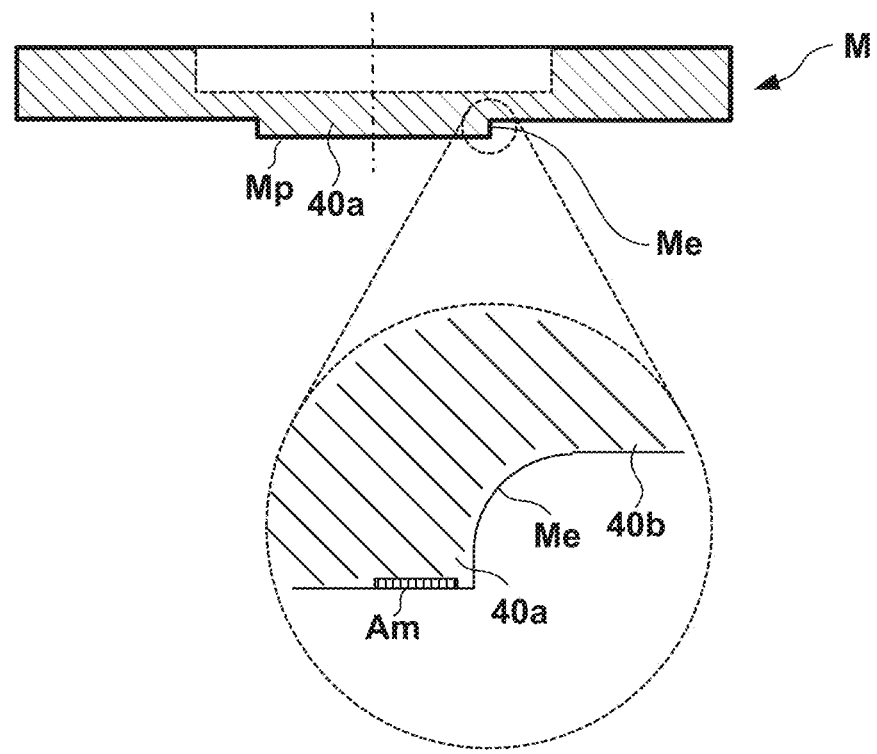
FIGS. 5A and 5B are views exemplifying the problem.
Figure 5B:
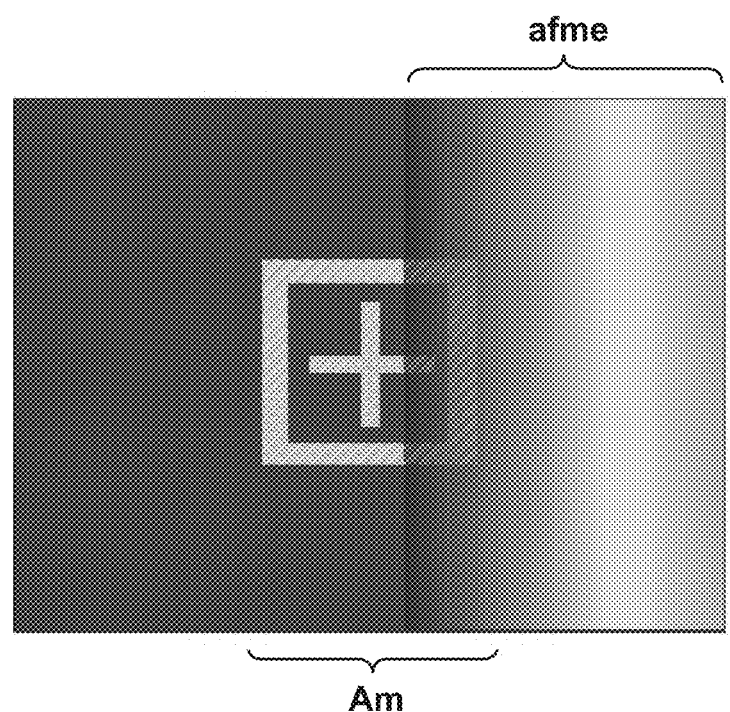

The second example will be described next with reference to FIGS. 5A and 5B. FIG. 5A schematically shows the sectional structure of the mold M in the second arrangement example. In the second arrangement example shown in FIG. 5A, the side Me of the mesa 40a is formed by including a curved surface. FIG. 5B schematically shows a result (image data) of detecting the mark Am of the mold M in the second arrangement example by the alignment optical system 2. The region afme shown in FIG. 5B is a light intensity distribution formed by light from the ridge line and the side Me of the mesa 40a, and the skirt of the light intensity distribution is overlaid on the mark image of the mark Am. Consequently, the quality of the mark image degrades, and it is impossible to, for example, correctly detect the position (for example, the central position) of the mark image.

Figure 6A:
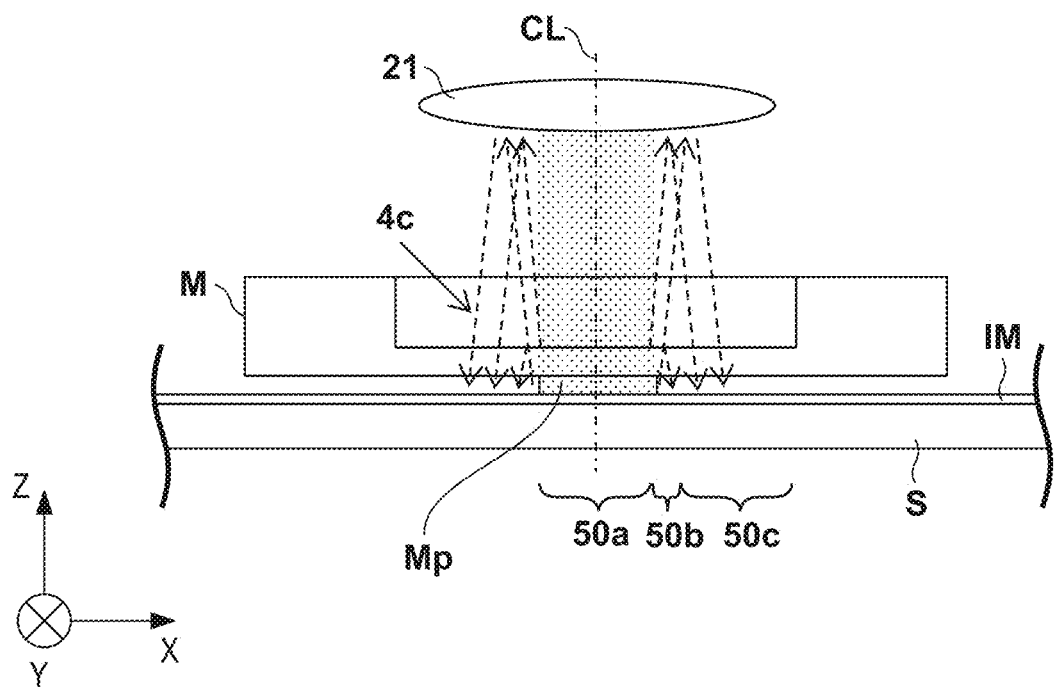
FIGS. 6A and 6B are views exemplifying the problem.
Figure 6B:
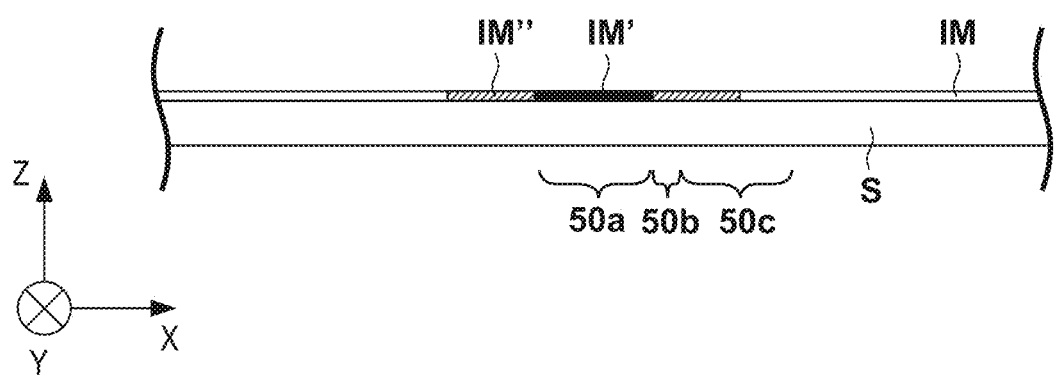

The third example will be described next with reference to FIGS. 6A to 8B. As schematically shown in FIG. 6A, when irradiating the imprint material IM on one shot region 50a of the plurality of shot regions with curing light CL, reflected light beams from the substrate S and the mold M can be reflected again (dotted arrows) by the mold M and the optical component 21. Thus, flare light can enter a wide range of the substrate S. As a result, as shown in FIG. 6B, not only the imprint material IM on the shot region 50a but also the imprint material IM on a peripheral region 50b and an adjacent shot region 50c of the shot region 50a can be cured. In FIG. 6B, a black imprint material IM' indicates an imprint material cured by irradiation with the curing light CL, and a hatched imprint material IM" indicates a semi-cured imprint material. If the imprint material IM on the peripheral region 50b and the adjacent shot region 50c is cured in this way, in the adjacent shot region 50c to undergo an imprint process later, the imprint process may not be performed normally.

The above phenomenon can occur not only when performing the imprint process after arranging the imprint material over the entire substrate S but also when performing the imprint process after arranging the imprint material on two or more adjacent shot regions.

If the above phenomenon cannot be overlooked, a light amount adjuster 9 can be provided in the peripheral portion 40b of the mesa 40a, as exemplified in FIG. 2. The light amount adjuster 9 can function to attenuate or block curing light. The light amount adjuster 9 ideally has as its feature to block curing light and transmit observation illumination light and alignment illumination light. However, it is not easy to provide a member having such feature in the mold M. The light amount adjuster 9 can be made of a metal that blocks all of curing light, observation illumination light, and alignment illumination light, for example, chromium. However, in this case, illumination light is reflected or scattered by the light amount adjuster 9, and is mixed into the alignment optical system 2 as noise light, thereby adversely influencing detecting of the mark Am.

Figure 7:
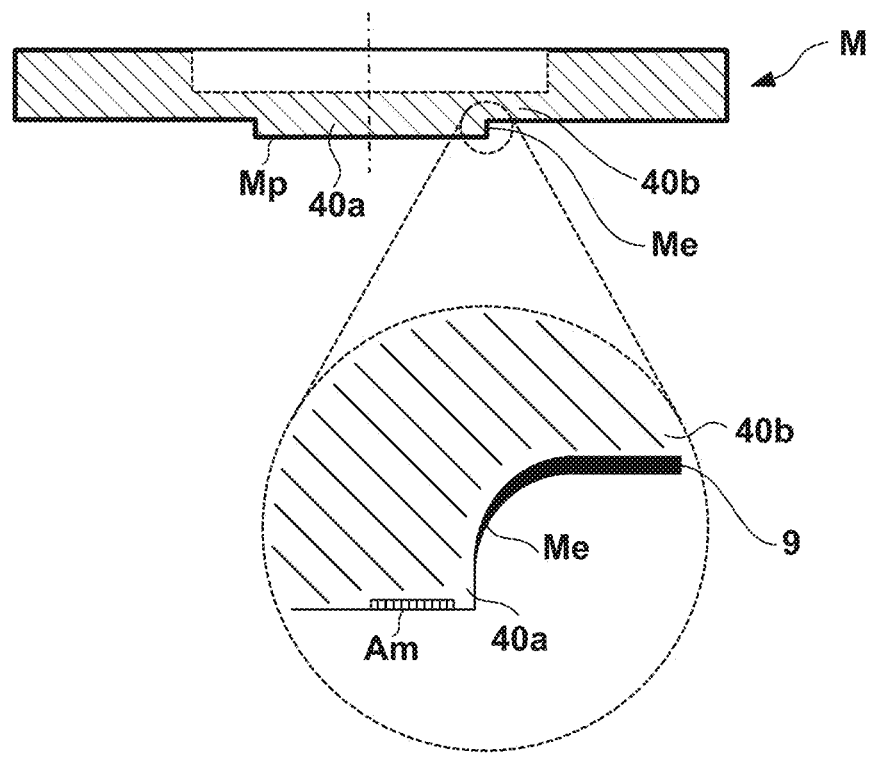
FIG. 7 is a view exemplifying the problem.
Figure 8A:
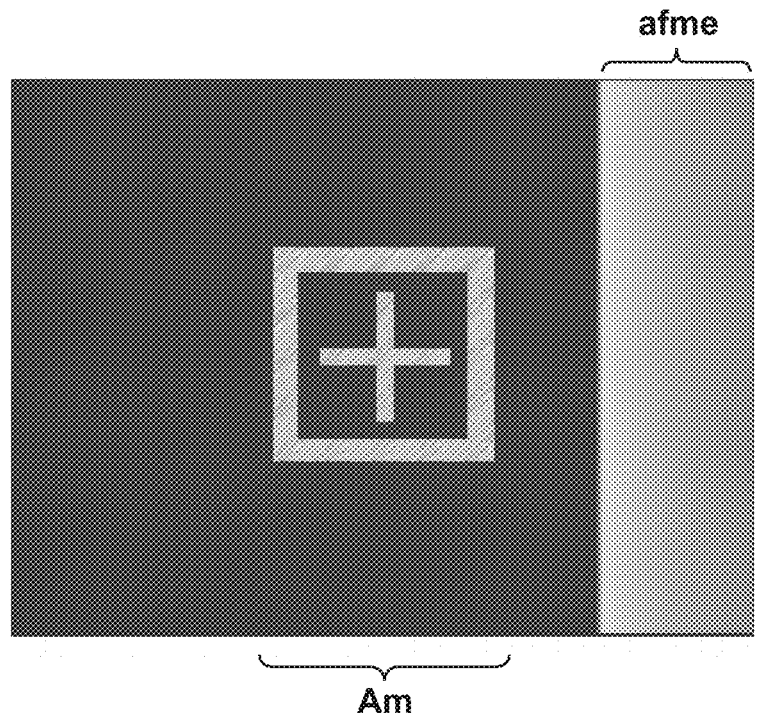
FIGS. 8A and 8B are views exemplifying the problem.
Figure 8B:
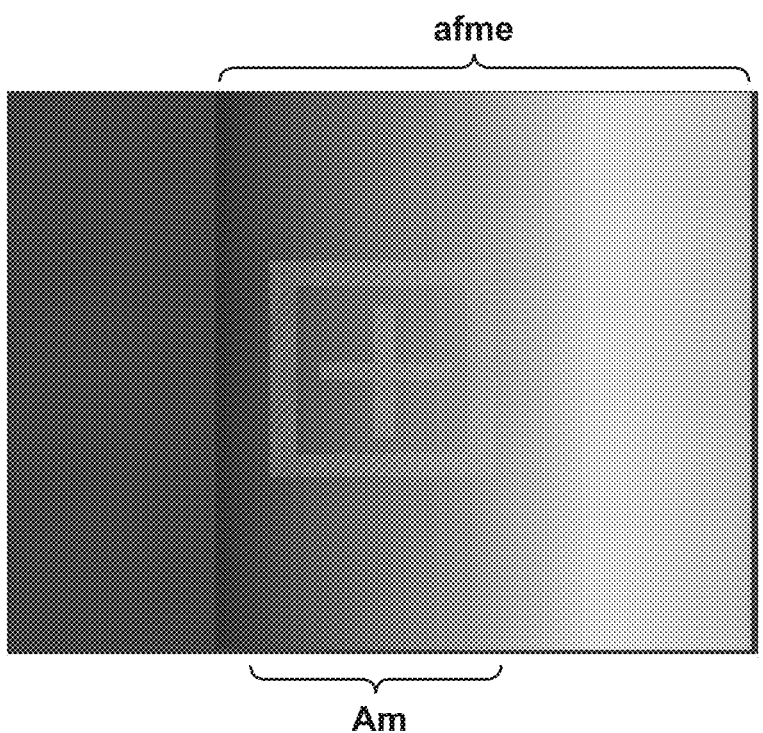

FIG. 7 schematically shows the sectional structure of the mold M in the third arrangement example. In the mold M in the third arrangement example, the light amount adjuster 9 is provided in the peripheral portion 40b. FIGS. 8A and 8B each schematically show a result (image data) of detecting the mark Am of the mold M in the third arrangement example by the alignment optical system 2. As shown in FIG. 8A, there is no problem if the region afme having the light intensity distribution formed by light from the ridge line and the side Me of the mesa 40a is not overlaid on the mark image of the mark Am. However, if, as shown in FIG. 8B, the region afme having the light intensity distribution formed by light from the ridge line and the side Me of the mesa 40a is overlaid on the mark image of the mark Am, the quality of the mark image degrades, and it is impossible to, for example, correctly detect the position of the mark image.

Figure 9:
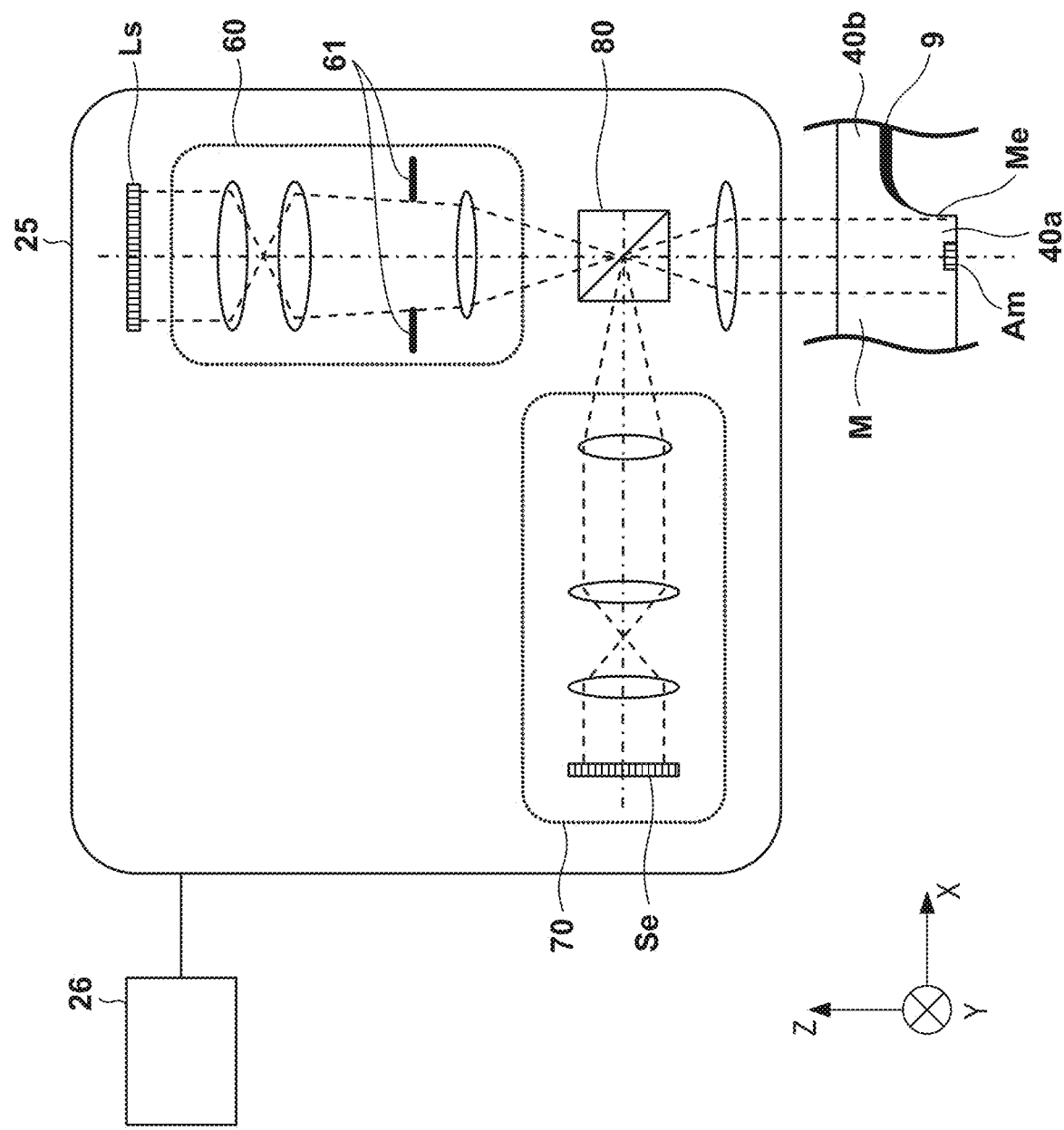
FIG. 9 is a view showing an example of the arrangement of a scope provided in an alignment optical system.

FIG. 9 shows an example of the arrangement of one of the scopes 25 of the alignment optical system 2 according to the embodiment. Note that FIG. 9 does not illustrate components such as an optical system between the scope 25 and the mold M. The alignment optical system 2 can include an adjustment mechanism 26 that adjusts the field of view of the scope 25 in accordance with the position of the mark to be detected. For example, the adjustment mechanism 26 can adjust the field of view of the scope 25 in accordance with the position of a pair of the mark 10 on the mold M and the mark 11 on the shot region of the substrate S. For example, the adjustment mechanism 26 can adjust the position of the scope 25 in the X-axis direction and the Y-axis direction, thereby adjusting the field of view of the scope 25.

The scope 25 can include, for example, a light source Ls, an illumination system 60, an image sensor (image capturer) Se, and a detecting system 70. The illumination system 60 illuminates the mark Am on the mold M with illumination light from the light source Ls. For example, the illumination system 60 may illuminate the mark Am on the mold M via an optical member such as a prism 80. As the light source Ls, for example, a light emitting component such as a halogen lamp, an LED, or an LD can be used. Illumination light from the light source Ls may be guided to the illumination system 60 by an optical fiber or the like, or may be embedded in the illumination system 60. Light (reflected light, scattered light, or diffracted light) from the mark Am illuminated by the illumination system 60 forms an image (mark image) of the mark Am on the imaging plane of the image sensor Se by the detecting system 70.

The illumination system 60 can include a limiter 61 that limits the incidence of illumination light (alignment illumination light) to the side Me of the mesa 40a of the mold M and an outer region of the side Me. For example, the limiter 61 can be configured to prevent illumination light from directly entering the side Me of the mesa 40a of the mold M, the ridge line, and the outer region of the side Me. Alternatively, the limiter 61 can be configured to reduce illumination light entering the side Me of the mesa 40a of the mold M, the ridge line, and the outer region of the side Me. If the mold M includes the light amount adjuster 9, the limiter 61 can function to limit the incidence of illumination light to the light amount adjuster 9, for example, to prevent illumination light from directly entering the light amount adjuster 9 or reduce illumination light entering the light amount adjuster 9. The limiter 61 may be arranged at a position conjugate to the light amount adjuster 9 or the peripheral portion 40b (lower surface) of the mold M, at a position conjugate to the mark Am, or at a position conjugate to a position between the mark Am and the light amount adjuster 9 or the peripheral portion 40b of the mold M.

Figure 10:
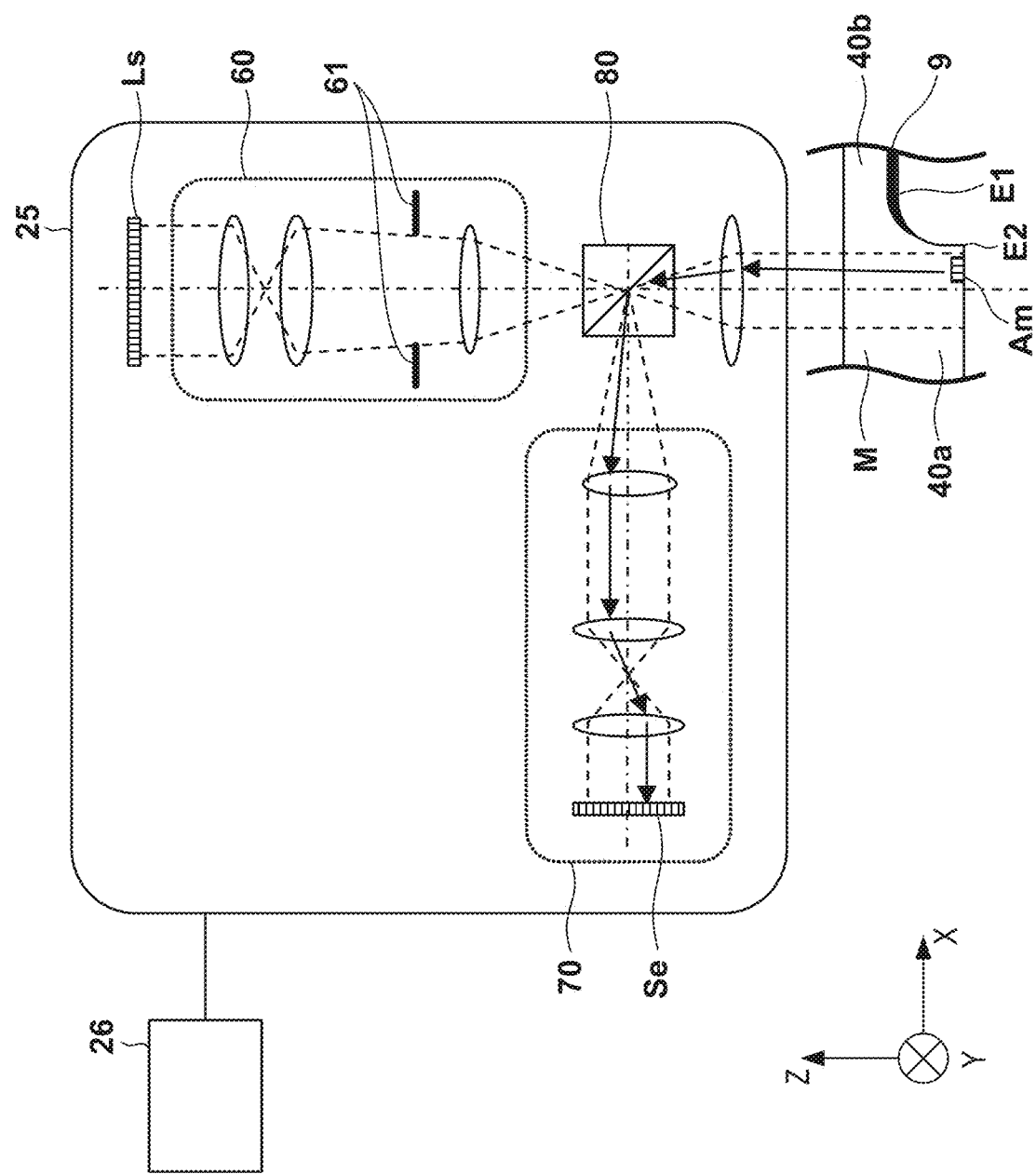
FIG. 10 is a view schematically showing the relative position among an image sensor (an imaging plane thereof), a mark, a light amount adjuster, and a limiter.
Figure 12:
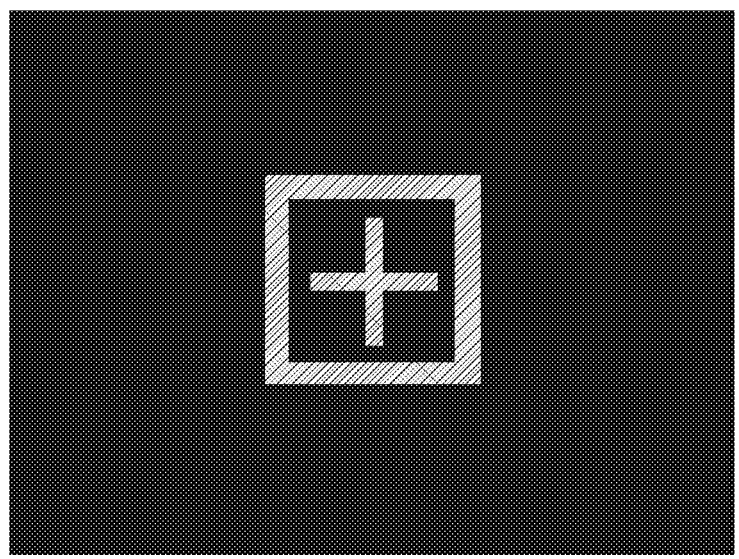
FIG. 12 is a view exemplifying image data of the mark.

FIG. 10 schematically shows the relative position among the image sensor Se (the imaging plane thereof), the mark Am, the light amount adjuster 9, and the limiter 61. The side Me of the mold M may be formed not by a vertical surface but by a curved surface. The curvature of the curved surface may be different in accordance with the specification of the mold M. The position of the edge (the edge of illumination light on the optical axis side) of the limiter 61 can be determined in consideration of, for example, the structure of the side Me of the mold M, the position of the light amount adjuster 9, the arrangement accuracy of the mold M with respect to the mold driving mechanism 6, and the like. For example, the position of the edge of the limiter 61 can be determined in accordance with a ridge line E2 between the side Me and the pattern region of a mesa M and a boundary E1 between the side Me and a flat portion of the peripheral portion 40b. FIG. 12 exemplifies image data of a mark detected by the image sensor Se. By providing the limiter 61, the influence of light from the side of the mesa and the ridge line or the light amount adjuster is suppressed, thereby obtaining high-quality image data. According to this embodiment, it is possible to accurately detect the position of the mark provided on the mold, the substrate, or the like or the relative position between the mark provided on the mold and the mark provided on the substrate.

Figure 11A:
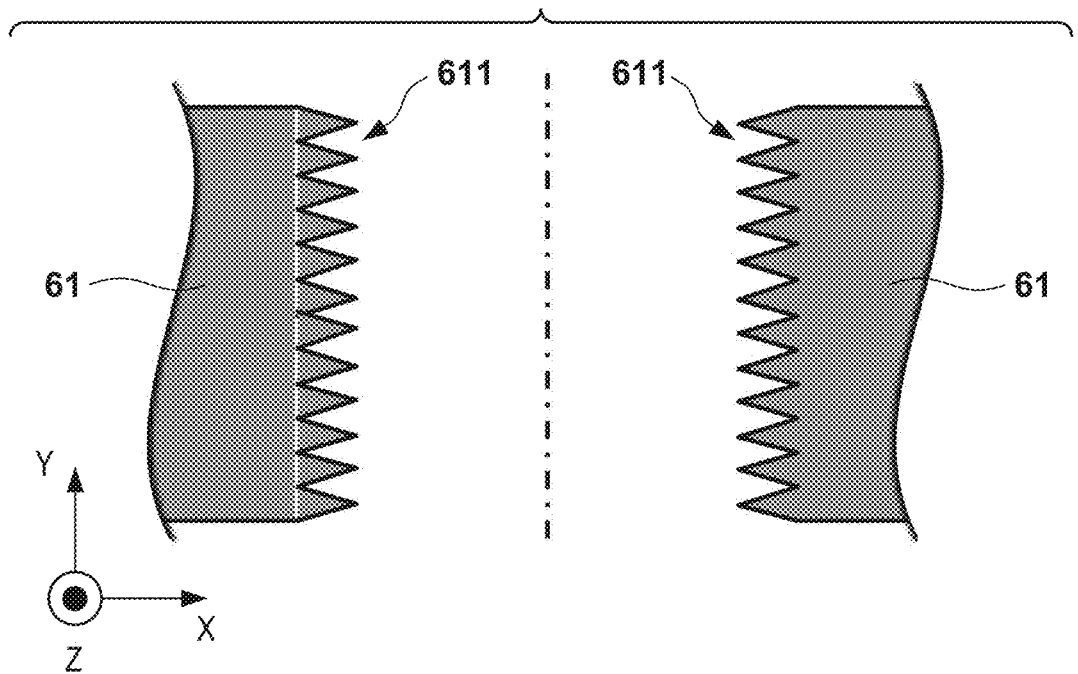
FIGS. 11A and 11B are views each showing an example of the arrangement of the limiter.
Figure 11B:
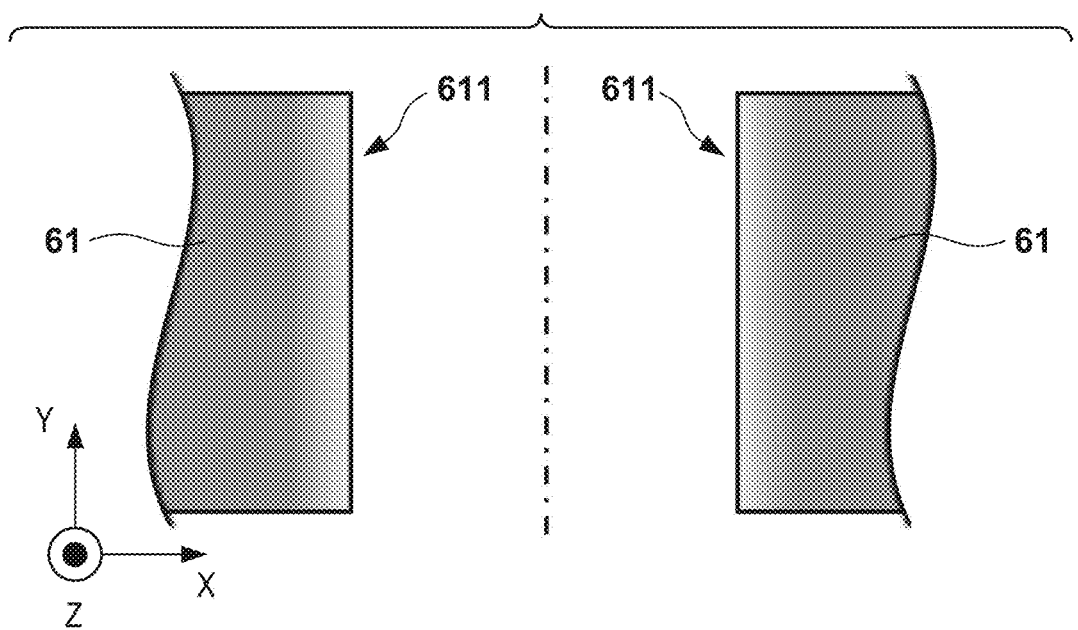

FIG. 11A shows an example of the arrangement of the limiter 61. As exemplified in FIG. 11A, the limiter 61 includes an edge 611 that defines the sectional shape of illumination light passing through the surface on which the limiter 61 is arranged, and the edge 611 can have a triangular wave shape. This structure is advantageous in preventing the incidence of reflected light or scattered light from the limiter 61 to the imaging plane of the image sensor Se. FIG. 11B shows another example of the arrangement of the limiter 61. As exemplified in FIG. 11B, the limiter 61 has a structure in which a transmittance gradually decreases toward the edge 611. This structure is also advantageous in preventing the incidence of reflected light or scattered light from the limiter 61 to the imaging plane of the image sensor Se.

Figure 13:
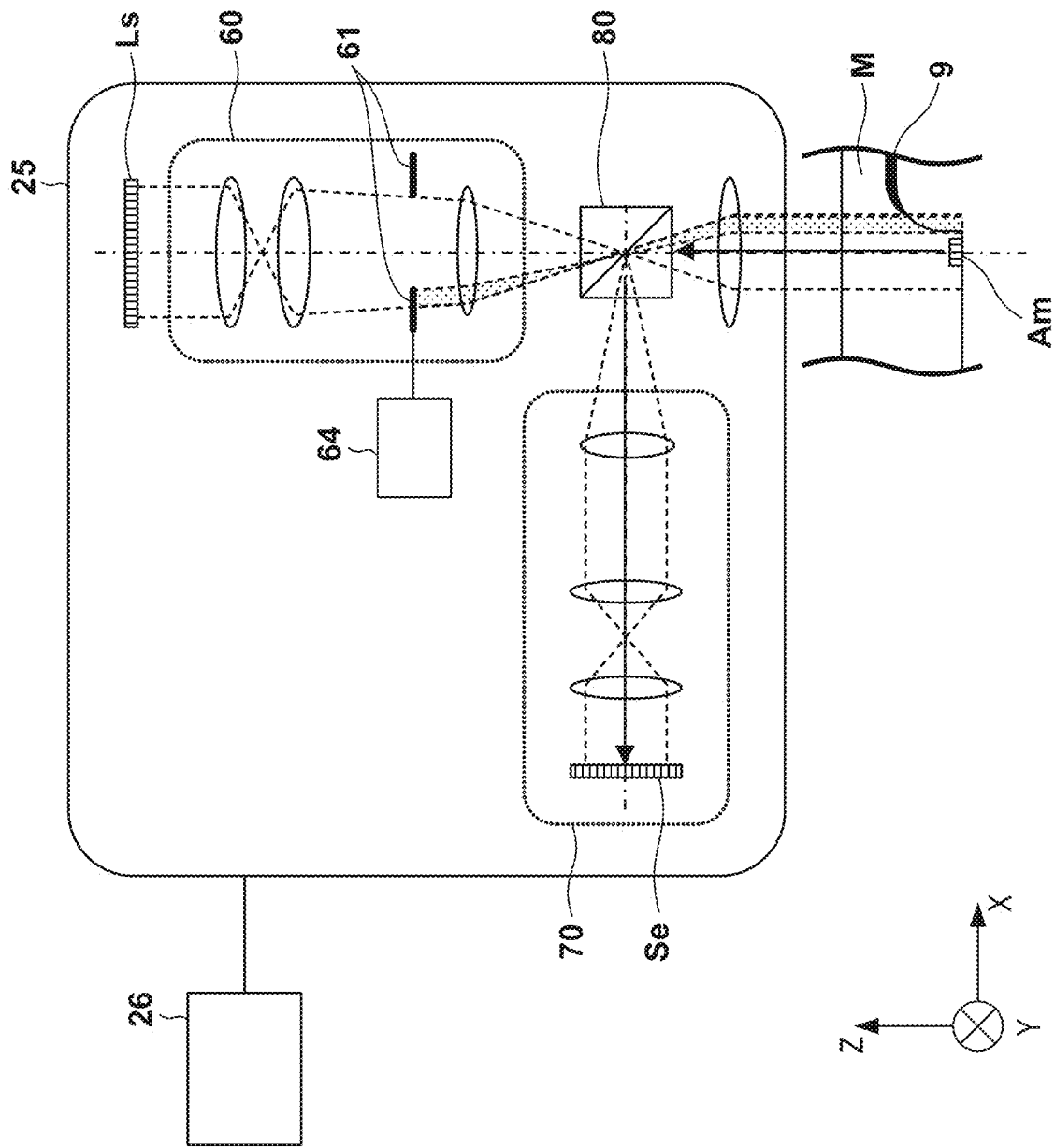
FIG. 13 is a view showing another example of the arrangement of the scope provided in the alignment optical system.

FIG. 13 shows another example of the arrangement of the scope 25. The above-described scope 25 of the alignment optical system 2 can be replaced by the scope 25 exemplified in FIG. 13. The scope 25 or the illumination system 60 includes a driving mechanism 64 that drives the limiter 61 so as to change the region of the mold M where illumination light enters. In a state in which the adjustment mechanism 26 adjusts the field of view of the detecting system 70 so that the mark Am of the mesa 40a of the mold M enters the field of view of the detecting system 70, the driving mechanism 64 can drive the limiter 61 so as to limit the incidence of illumination light to the side Me of the mesa M, the ridge line of the mesa M, and the outer region of the side Me. The outer region is, for example, the peripheral portion 40b. Alternatively, in this state, the driving mechanism 64 can drive the limiter 61 so that the evaluation value (for example, the contrast) of the image data of the mark becomes best or exceeds a predetermined reference value. Alternatively, in this state, the driving mechanism 64 can drive the limiter 61 under the control of AI (Artificial Intelligence) having been subjected to machine learning so as to obtain satisfactory image data of the mark. In this state, the side Me of the mesa M, the ridge line of the mesa M, and the outer region of the side Me can be included in the field of view of the detecting system 70. Alternatively, in this state, a shadow formed by the limiter 61 can be included in the field of view of the detecting system 70.

Figure 14:
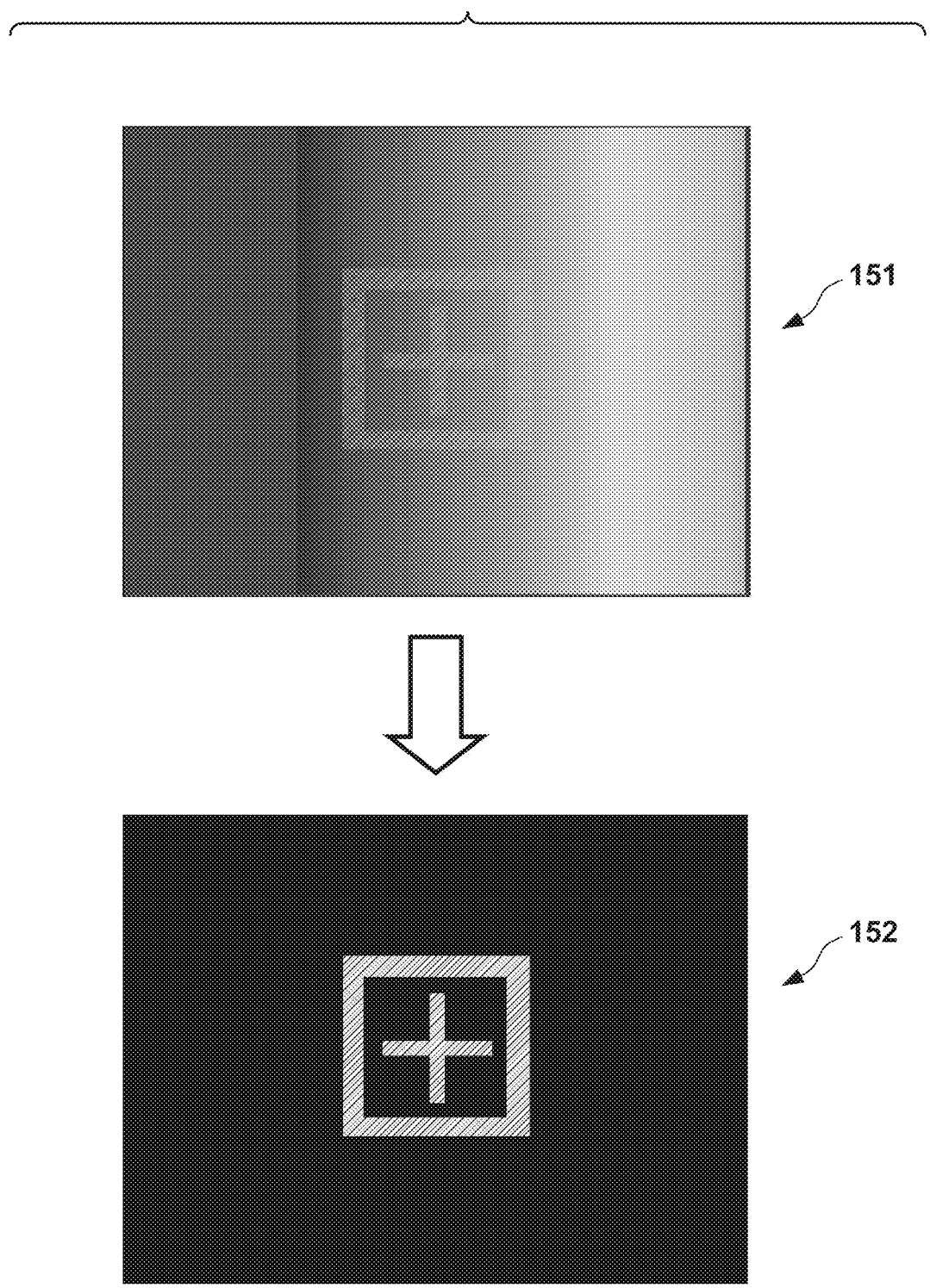
FIG. 14 is a view exemplifying the improvement of the image data of the mark by providing the limiter.

FIG. 14 exemplifies the improvement of the image data of mark from image data 151 to image data 152 by driving the limiter 61 by the driving mechanism 64. The image data 151 and 152 show a state in which the shadow formed by the limiter 61 is included in the field of view of the detecting system 70. The field of view of the detecting system 70 can be adjusted by the adjustment mechanism 26 so that the mark is arranged at the center of the field of view of the detecting system 70. Since a portion around the center of the field of view of the detecting system 70 is generally a region where aberrations are small, it is possible to improve the detecting accuracy of the position of the mark by arranging the mark at the center of the field of view of the detecting system 70. In this state, the side of the mesa or the light amount adjuster is often included in the field of view of the detecting system 70. Therefore, if there is no limiter 61 or adjustment of the limiter 61 is inappropriate, it is impossible to obtain a high-quality mark image. However, by providing the limiter 61 and the driving mechanism 64 that drives the limiter 61, satisfactory image data exemplified as the image data 152 can be obtained. From another viewpoint, according to the second embodiment, it is unnecessary to reduce aberrations of the detecting system 70 in the entire field of view, which can contribute to simplification of the arrangement of the detecting system 70 and reduction of the cost. The shape of the mark is not limited to a square, and the mark can have various shapes such as a rectangle or a polygon, and also have various sizes. From the viewpoint of coping various marks, the driving mechanism 64 that drives the limiter 61 is useful.

Figure 15A:
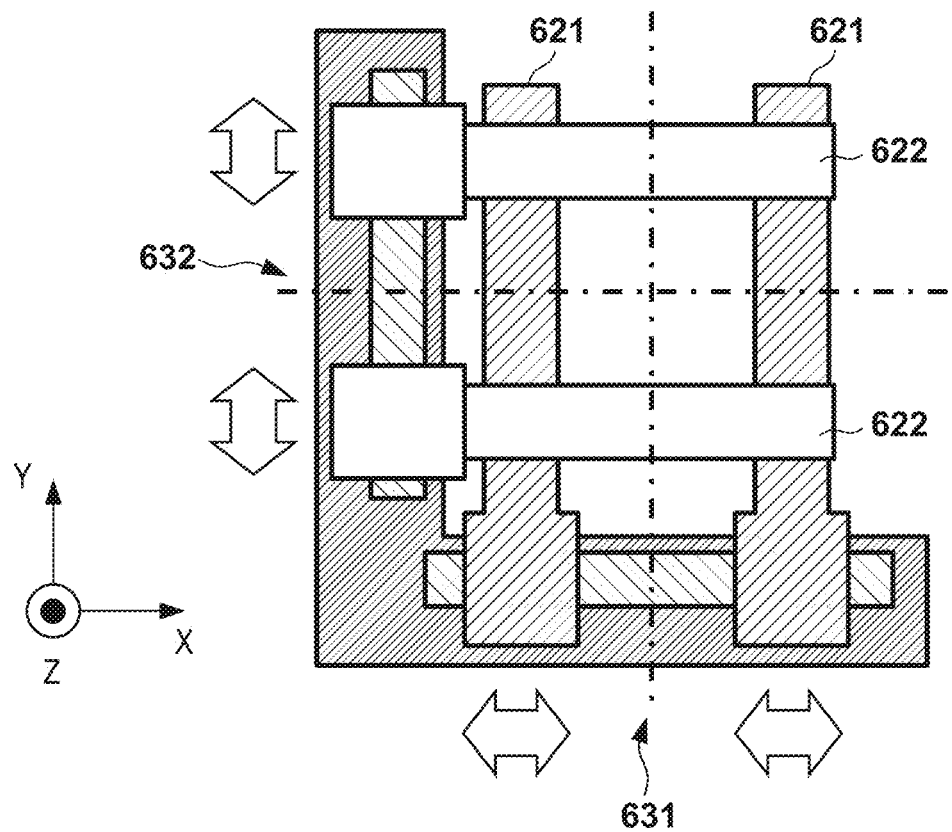
FIGS. 15A and 15B are views showing an example of the arrangement of the limiter and a driving mechanism.
Figure 15B:
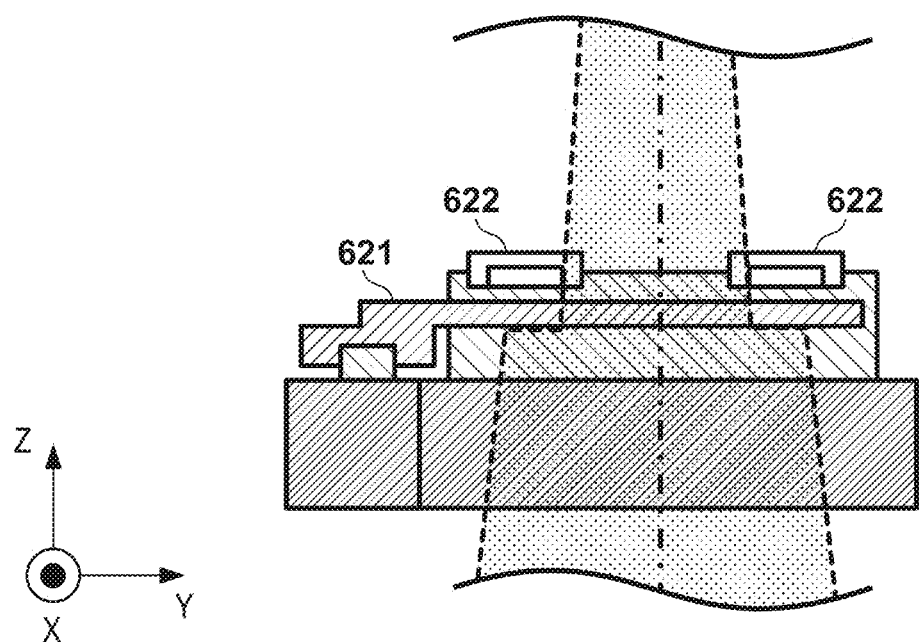

FIGS. 15A and 15B show an example of the arrangement of the limiter 61 and the driving mechanism 64. The limiter 61 can include a plurality of movable members 621 and 622. The driving mechanism 64 can include driving mechanisms 631 and 632 that drive the plurality of movable members 621 and 622. In one example, the two movable members 621 can define two opposing sides of a rectangular illumination field, and the two movable members 622 can define other two opposing sides of the illumination field. The driving mechanism 631 can be configured to drive the two movable members 621 in the first direction, and the driving mechanism 632 can be configured to drive the two movable members 622 in the second direction orthogonal to the first direction.

Figure 16A:
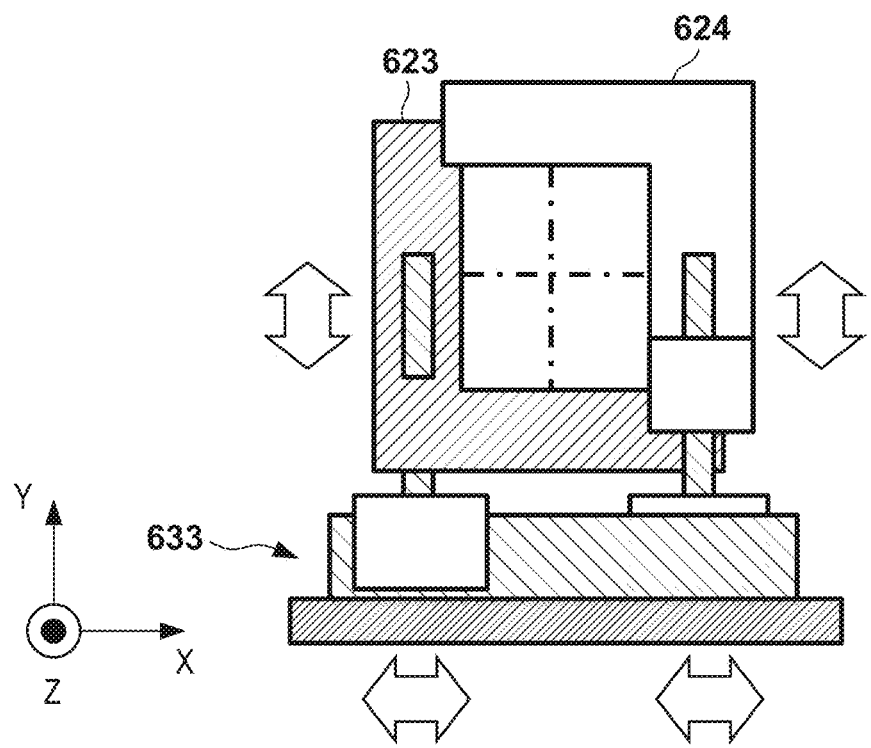
FIGS. 16A and 16B are views showing another example of the arrangement of the limiter and the driving mechanism.
Figure 16B:
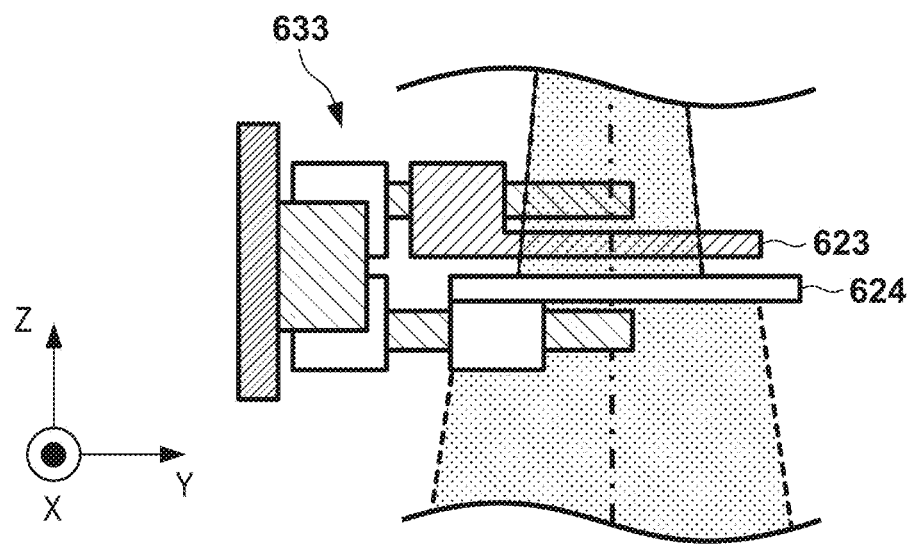

FIGS. 16A and 16B show another example of the arrangement of the limiter 61 and the driving mechanism 64. The limiter 61 can include a plurality of movable members 623 and 624, and the driving mechanism 64 can include a driving mechanism 633 that drives the plurality of movable members 623 and 624. In one example, the two movable members 623 and 624 each have an L shape, and the two movable members 623 and 624 can define a rectangular illumination field. The driving mechanism 633 can be configured to drive the movable member 623 in the first and second directions, and also drive the movable member 624 in the first and second directions.

Figure 17:
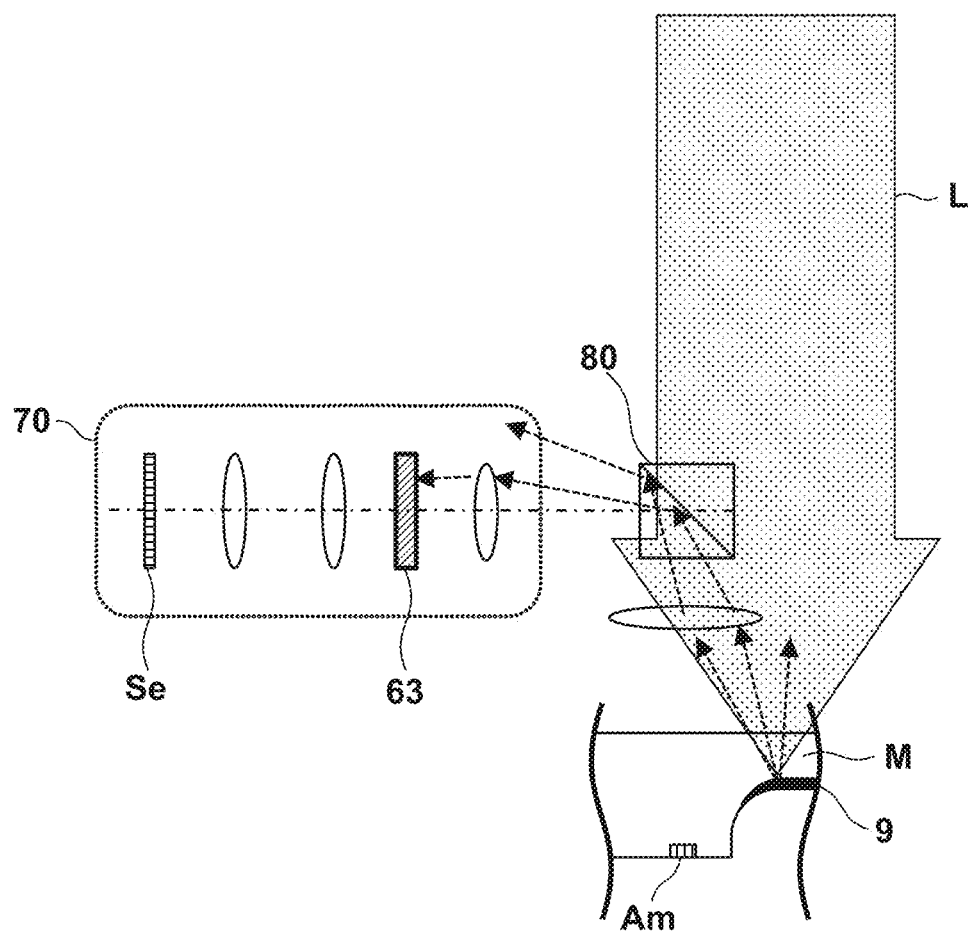
FIG. 17 is a view showing a modification.

FIG. 17 shows a modification of the above embodiment. The mold M can be irradiated with second illumination light L from various irradiators such as the curing unit 1, the observation optical system 3, and the thermal deformation unit. The wavelength band of the second illumination light L is different from that of illumination light from the illumination system 60 of the alignment optical system 2. The second illumination light L can be reflected or scattered by the mesa M or the light amount adjuster 9. The detecting system 70 of the alignment optical system 2 can include an optical component 63 that blocks or attenuates the second illumination light L. The optical component 63 can be, for example, a wavelength selection component. The optical component 63 can transmit light of the wavelength band of illumination light generated by the illumination system 60 of the alignment optical system 2, and block, reflect, or absorb light beams of other wavelength bands. By providing the optical component 63, it is possible to detect the mark more accurately.

The pattern of a cured product formed using an imprint apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, an SRAM, a flash memory, and an MRAM and semiconductor elements such as an LSI, a CCD, an image sensor, and an FPGA. The mold includes an imprint mold or the like.

The pattern of the cured product is directly used as at least some of the constituent members of the above-described articles or used temporarily as a resist mask. After etching or ion implantation is performed in the substrate processing step, the resist mask is removed.

Figure 18A:
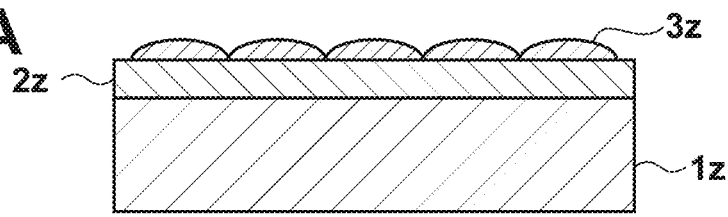
FIGS. 18A to 18F are views exemplifying an article manufacturing method.

An article manufacturing method in which an imprint apparatus forms a pattern on a substrate, processes the substrate on which the pattern is formed, and manufactures an article from the processed substrate will be described next. As shown FIG. 18A, a substrate $1z$ such as a silicon wafer with a processed material $2z$ such as an insulator formed on the surface is prepared. Next, an imprint material $3z$ is applied to the surface of the processed material $2z$ by an inkjet method or the like. A state in which the imprint material $3z$ is applied as a plurality of droplets onto the substrate is shown here.

Figure 18B:
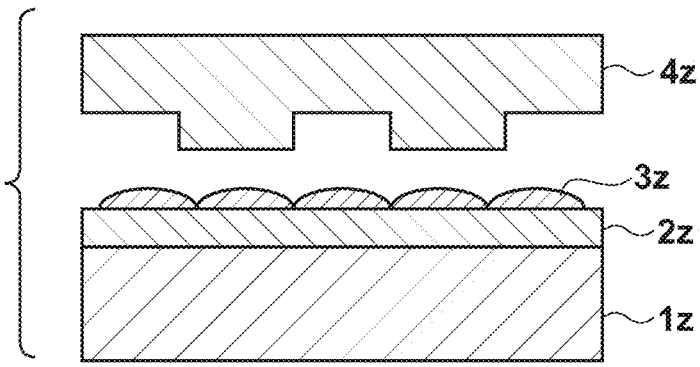
Figure 18C:
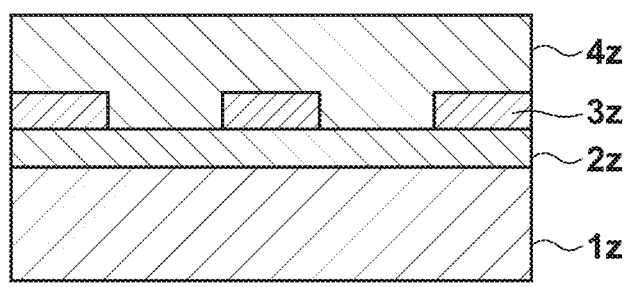

As shown in FIG. 18B, a side of a mold $4z$ for imprint with a concave-convex pattern is directed toward and made to face the imprint material $3z$ on the substrate. As shown FIG. 18C, the substrate $1z$ to which the imprint material $3z$ is applied is brought into contact with the mold $4z$, and a pressure is applied. The gap between the mold $4z$ and the processed material $2z$ is filled with the imprint material $3z$. In this state, when the imprint material $3z$ is irradiated with light as energy for curing via the mold $4z$, the imprint material $3z$ is cured.

Figure 18D:
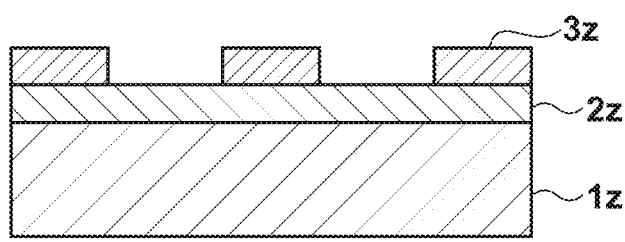

As shown in FIG. 18D, after the imprint material $3z$ is cured, the mold $4z$ is separated from the substrate $1z$, and the pattern of the cured product of the imprint material $3z$ is formed on the substrate $1z$. In the pattern of the cured product, the concave portion of the mold corresponds to the convex portion of the cured product, and the convex portion of the mold corresponds to the concave portion of the cured product. That is, the concave-convex pattern of the mold $4z$ is transferred to the imprint material $3z$.

Figure 18E:
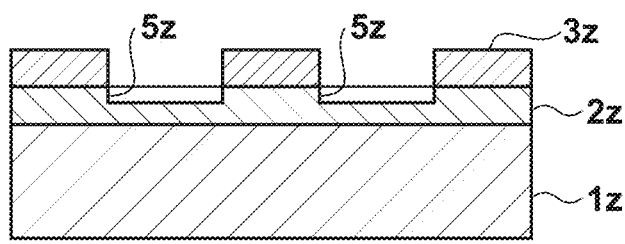
Figure 18F:
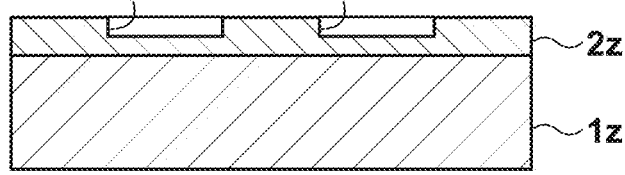

As shown in FIG. 18E, when etching is performed using the pattern of the cured product as an etching resistant mask, a portion of the surface of the processed material $2z$ where the cured product does not exist or remains thin is removed to form a groove $5z$. As shown in FIG. 18F, when the pattern of the cured product is removed, an article with the grooves $5z$ formed in the surface of the processed material $2z$ can be obtained. Here, the pattern of the cured product is removed. However, instead of removing the pattern of the cured product after the process, it may be used as, for example, an interlayer dielectric film included in a semiconductor element or the like, that is, a constituent member of an article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-070709, filed Apr. 2, 2019, which is hereby incorporated by reference herein in its entirety.

What is claimed is:

1. An imprint apparatus for forming a pattern of an imprint material on a substrate having a first alignment mark, using a mold having a mesa including a pattern region where a pattern and a second alignment mark are formed, comprising:
    an optical system including an illumination system configured to illuminate the first alignment mark and the second alignment mark with illumination light, and a detecting system configured to detect an alignment mark image formed by the first alignment mark and the second alignment mark illuminated with the illumination light from the illumination system, and
    wherein the illumination system includes a limiter configured to define an illumination area of the illumination light and limit incidence of the illumination light to the pattern, a side of the mesa, a ridge line of the mesa, and an outer region of the side,
    wherein an edge of the limiter is arranged to block the illumination light to a region between a central region of the mesa and a portion where the second alignment mark is arranged, and a region between the portion and the ridge line, and
    wherein the imprint apparatus obtains a relative position between the first alignment mark and the second alignment mark based on the alignment mark image detected by the detecting system while limiting incidence of the illumination light to the side of the mesa, the ridge line of the mesa, and the outer region of the side by the limiter and performs alignment between the substrate and the mold based on the obtained relative position.

2. The apparatus according to claim 1, wherein the limiter is configured to prevent the illumination light from directly entering the side, the ridge line, and the outer region.

3. The apparatus according to claim 1, wherein the limiter is configured to reduce the illumination light entering the side, the ridge line, and the outer region.

4. The apparatus according to claim 1, wherein the illumination system further includes a driving mechanism configured to drive the limiter so as to limit incidence of the illumination light to the side, the ridge line, and the outer region.

5. The apparatus according to claim 4, wherein the limiter includes a plurality of movable members, and the driving mechanism drives the plurality of movable members.

6. The apparatus according to claim 4, further comprising an adjustment mechanism configured to adjust a field of view of the detecting system,
    wherein the driving mechanism drives the limiter to limit the incidence of the illumination light to the side, the ridge line, and the outer region in a state in which the adjustment mechanism adjusts the field of view so that the first alignment mark and the second alignment mark is included in the field of view.

7. The apparatus according to claim 4, wherein a shadow formed by the limiter is included in a field of view of the detecting system.

8. The apparatus according to claim 1, wherein the limiter includes an edge that defines a sectional shape of the illumination light passing through the limiter, and the edge has a structure that reduces reflected light and scattered light from the edge.

9. The apparatus according to claim 1, wherein the limiter includes an edge that defines a sectional shape of the illumination light passing through a surface on which the limiter is arranged, and the edge has a triangular wave shape.

10. The apparatus according to claim 1, wherein the limiter has a structure in which a transmittance gradually decreases toward the edge of the limiter.

11. The apparatus according to claim 1, further comprising an irradiator configured to irradiate the mold with second illumination light having a wavelength band different from a wavelength band of the illumination light,
    wherein the detecting system includes an optical component configured to block or attenuate the second illumination light.

12. The apparatus according to claim 1, further comprising an adjustment mechanism configured to adjusting a position of the optical system,
    wherein the position of the optical system is adjusted so that the edge of the illumination area is arranged in accordance with the position of the ridge line of the mesa.

13. The apparatus according to claim 12, wherein a position of the optical system is adjusted so that the edge of the illumination area is arranged at the position of the ridge line of the mesa.

14. An article manufacturing method comprising:
   forming a pattern on a substrate using an imprint apparatus; and
   processing the substrate on which the pattern has been formed in the forming,
   wherein an article is manufactured from the processed substrate,
   wherein the imprint apparatus is configured to forming a pattern of an imprint material on the substrate having a first alignment mark, using a mold having a mesa including a pattern region where a pattern and a second alignment mark are formed, and comprises:
   an optical system including an illumination system configured to illuminate the first alignment mark and the second alignment mark with illumination light, and a detecting system configured to detect an alignment mark image formed by the first alignment mark and the second alignment mark illuminated with the illumination light from the illumination system, and
   wherein the illumination system includes a limiter configured to define an illumination area of the illumination light and limit incidence of the illumination light to a region between a central region of the mesa and the second alignment mark, and a region between the second alignment mark and the ridge line,
   wherein an edge of the limiter is arranged to block the illumination light to a region between the central region of the mesa and a portion where the second alignment mark is arranged, and a region between the portion and the ridge line, and
   wherein the imprint apparatus obtains a relative position between the first alignment mark and the second alignment mark based on the alignment mark image detected by the detecting system while limiting incidence of the illumination light to the side of the mesa, the ridge line of the mesa, and the outer region of the side by the limiter and performs alignment between the substrate and the mold based on the obtained relative position.

* * * * *